(12) United States Patent
Engel et al.

(10) Patent No.: US 8,237,437 B2
(45) Date of Patent: Aug. 7, 2012

(54) TWO-AXIS MAGNETIC FIELD SENSOR WITH MULTIPLE PINNING DIRECTIONS

(75) Inventors: Bradley N Engel, Chandler, AZ (US); Phillip G. Mather, Chandler, AZ (US); Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 13/023,260

(22) Filed: Feb. 8, 2011

(65) Prior Publication Data
US 2011/0121826 A1    May 26, 2011

Related U.S. Application Data

(62) Division of application No. 12/117,396, filed on May 8, 2008.

(51) Int. Cl.
*G01R 33/09* (2006.01)
*G01R 33/02* (2006.01)

(52) U.S. Cl. .................................... 324/252; 324/249

(58) Field of Classification Search ............ 324/207.21, 324/252, 249; 338/32 R; 360/324, 324.11, 360/324.12, 324.2
See application file for complete search history.

(56) References Cited

U.S. PATENT DOCUMENTS

| 5,919,580 A * | 7/1999 | Barnard et al. ............... 428/811 |
| 6,191,578 B1 * | 2/2001 | Bezinge et al. ............ 324/207.21 |
| 7,023,310 B2 * | 4/2006 | Oohashi et al. ............... 335/306 |
| 7,064,937 B2 * | 6/2006 | Wan et al. .................. 360/324.1 |
| 2004/0013727 A1 | 1/2004 | Gorissen et al. |
| 2004/0137275 A1 | 7/2004 | Jander et al. |
| 2007/0164734 A1 * | 7/2007 | Shimizu et al. .......... 324/207.25 |
| 2007/0183187 A1 | 8/2007 | Guo |
| 2008/0273279 A1 | 11/2008 | Paul et al. |
| 2009/0086385 A1 | 4/2009 | Gill et al. |

FOREIGN PATENT DOCUMENTS

WO   2005093448 A1   10/2005

OTHER PUBLICATIONS

PCT International Search Report for PCT Application No. PCT/US2009/043354 mailed Aug. 19, 2009.
Xi, H. et al. "Exchange Coupling of NiFe/CrMnPtx Bilayers Prepared by a Substrate Bias Sputtering Method," Journal of Applied Physics, vol. 87, No. 1; Jan. 1, 2000. pp. 410-415.
Office Action issued in Chinese Patent Application No. 200980121423.6 on Dec. 20, 2011.

* cited by examiner

*Primary Examiner* — Bot Ledynh
(74) *Attorney, Agent, or Firm* — Ingrassia Fischer & Lorenz, P.C.

(57) ABSTRACT

A fabrication process and apparatus provide a high-performance magnetic field sensor (200) from two differential sensor configurations (201, 211) which require only two distinct pinning axes (206, 216) which are formed from a single reference layer (60) that is etched into high aspect ratio shapes (62, 63) with their long axes drawn with different orientations so that, upon treating the reference layers with a properly aligned saturating field (90) and then removing the saturating field, the high aspect ratio patterns provide a shape anisotropy that forces the magnetization of each patterned shape (62, 63) to relax along its respective desired axis. Upon heating and cooling, the ferromagnetic film is pinned in the different desired directions.

14 Claims, 7 Drawing Sheets

US 8,237,437 B2

TWO-AXIS MAGNETIC FIELD SENSOR WITH MULTIPLE PINNING DIRECTIONS

CROSS-REFERENCES TO RELATED APPLICATIONS

This is a division of U.S. application Ser. No. 12/117,396, filed May 8, 2008.

BACKGROUND OF THE INVENTION

1. Field of the Invention

The present invention is directed in general to the field of magnetoelectronic devices. In one aspect, the present invention relates to CMOS-compatible magnetoelectronic field sensors used to sense magnetic fields.

2. Description of the Related Art

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally consist of anisotropic magnetoresistance (AMR) based devices. In order to arrive at the required sensitivity and reasonable resistances that mesh well with CMOS, the sensing units of such sensors are generally in the order of square millimeters in size. For mobile applications, such AMR sensor configurations are too costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ sensors and GMR sensors have been employed in a Wheatstone bridge structure to increase sensitivity and to eliminate temperature dependent resistance changes. Indeed, two-axis magnetic field sensors have been developed for electronic compass applications to detect the earth's field direction by using a Wheatstone bridge structure for each sense axis. However, such field sensors typically include two opposite pinning directions for each sense axis, resulting in four different pinning directions which must be individually set for each circuit utilizing a magnet array with complex and unwieldy magnetization techniques, or employ a thick NiFe shield/flux concentrating layer to direct the local direction of a lower intermediate field requiring additional process complexity.

Accordingly, a need exists for an improved sensor design and fabrication process for forming reference electrodes with different magnetization directions. There is also a need for a dual-axis sensor that can be efficiently and inexpensively constructed as an integrated circuit structure for use in mobile applications. There is also a need for an improved magnetic field sensor and fabrication to overcome the problems in the art, such as outlined above. Further limitations and disadvantages of conventional sensor technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
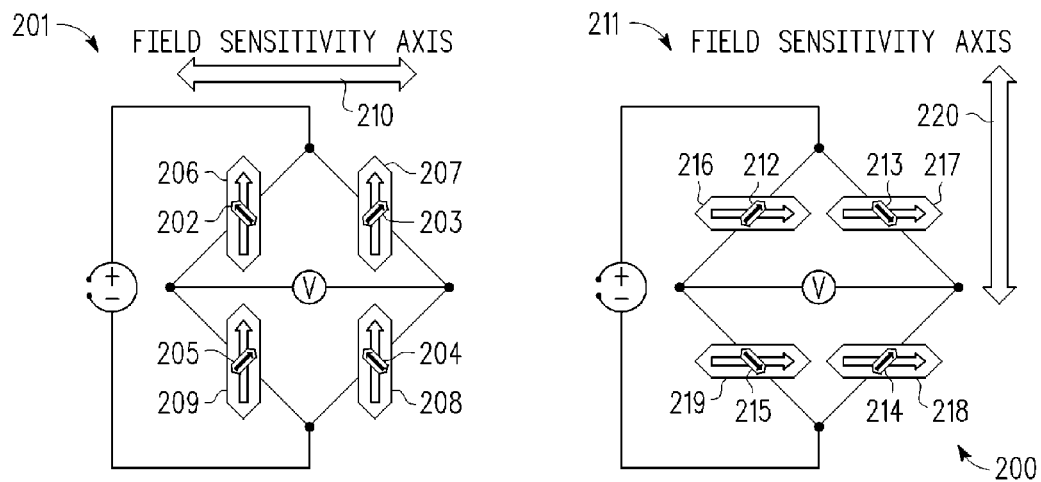
FIG. 1 illustrates an electronic compass structure which uses differential sensors formed from two bridge structures with unshielded MTJ sensors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for providing multi-axis pinning on a bulk wafer which may be used to form an integrated circuit sensor with different reference elements having different pinning directions that are set with a single pinning material deposition and bulk wafer setting procedure. As a preliminary step, a stack of one or more layers of ferromagnetic and antiferromagnetic materials is etched into shaped reference elements having a two-dimensional shape with a high aspect ratio, where the shape provides a distinction for the desired magnetization direction for each reference element. Depending on the materials and techniques used, the final magnetization direction may be oriented along the short axis or the long axis of the shaped layer. For example, if the pinned layer is formed with a slightly imbalanced synthetic anti-ferromagnet (SAF) patterned into micron-scale dimensions, the magnetization will direct along the short axis. As will be appreciated by those skilled in the art, the SAF embodiment provides a number of benefits related to the use of pinned-SAF reference layers in magnetoelectronic devices. In other embodiments, by controlling the thicknesses of the free and fixed layers, the final magnetization may be directed along the long axis. Using shape anisotropy, different magnetization directions are induced in the reference elements by heating in the presence of saturating field that is aligned between the desired magnetization directions for the reference elements. In selected embodiments, the reference elements are heated sufficiently to reduce the material component of the anisotropy and allow the shape and external field to dominate the magnetization direction. In this manner, once the saturating field is removed, the shape anisotropy directs the magnetization in the desired direction. Upon removing the saturating field, the magnetizations of the reference elements relax to follow the shape of the reference elements so as to induce a magnetization that is aligned along the desired axis of the shaped reference element and later pinned as the anneal temperature is reduced. For example, if two reference layers are shaped to have longer dimensions which are perpendicular to one another, then the induced magnetizations for the two reference layers will be perpendicular to one another. Finally, if the reference elements have not been annealed above the pinning temperature (which is the lower of either the antiferromagnetic blocking temperature or the antiferromagnetic crystalline phase formation temperature) of the antiferromagnet, then a single anneal process is applied to set the induced magnetizations for the two reference layers. With this approach, a single pinning material deposition step and a single anneal step are performed to set all induced magnetizations for the reference layers without requiring additional magnetic layers, thereby providing a bulk wafer setting procedure that simplifies and reduces the manufacturing cost and complexity. The simplified process for forming reference layers with different pinned directions allows independent magnetic sensor elements to be formed at a minimal spacing within the sensor die, and as a result, different sensor configurations within a single die of minimal area can have different sensitive axes.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent example embodiments of the invention. It should be noted that many alternative or additional circuit/component layouts may be present in a practical embodiment.

FIG. 1 shows a magnetic field sensor 200 formed with first and second differential sensors 201, 211 for detecting the component directions of an applied field along a first axis (e.g., the y-axis direction in the figure) and a second axis (e.g., the x-axis direction in the figure), respectively. As depicted, each sensor is formed with unshielded sense elements that are connected in a bridge configuration. Thus, the first sensor 201 is formed from the connection of a plurality of sense elements 202-205 in a bridge configuration over a corresponding plurality of pinned layers 206-209, where each of the pinned layers 206-209 is magnetized in the y-axis direction. In similar fashion, the second sensor 211 is formed from the connection of a plurality of sense elements 212-215 in a bridge configuration over a corresponding plurality of pinned layers 216-219 that are each magnetized in the x-axis direction that is perpendicular to the magnetization direction of the pinned layers 206-209. In the depicted bridge configuration 201, the sense elements 202, 204 are formed to have a first easy axis magnetization direction and the sense elements 203, 205 are formed to have a second easy axis magnetization direction, where the first and second easy axis magnetization directions are orthogonal with respect to one another and are oriented to differ equally from the magnetization direction of the pinned layers 206-209. As for the second bridge configuration 211, the sense elements 212, 214 have a first easy axis magnetization direction that is orthogonal to the second easy axis magnetization direction for the sense elements 213, 215 so that the first and second easy axis magnetization directions are oriented to differ equally from the magnetization direction of the pinned layers 216-219. In the depicted sensors 201, 211, there is no shielding required for the sense elements, nor are any special reference elements required. In an example embodiment, this is achieved by referencing each active sense element (e.g., 202, 204) with another active sense element (e.g., 203, 205) using shape anisotropy techniques to establish the easy magnetic axes of the referenced sense elements to be deflected from each other by 90 degrees. The configuration shown in FIG. 1 is not required to harvest the benefits of the dual axis pinning technique, and is only given as an example. For example, thin shields may also be used to suppress the sensor response of two of four identical sensor elements to achieve a differential response.

By positioning the first and second sensors 201, 211 to be orthogonally aligned with the orthogonal sense element orientations in each sensor being deflected equally from the sensor's pinning direction, the sensors can detect the component directions of an applied field along the first and second axes.

As seen from the foregoing, a magnetic field sensor may be formed from differential sensors 201, 211 which use unshielded sense elements 202-205, 212-215 connected in a bridge configuration over respective pinned layers 206, 216 to detect the presence and direction of an applied magnetic field. With this configuration, the magnetic field sensor provides good sensitivity, and also provides the temperature compensating properties of a bridge configuration.

Figure 2:
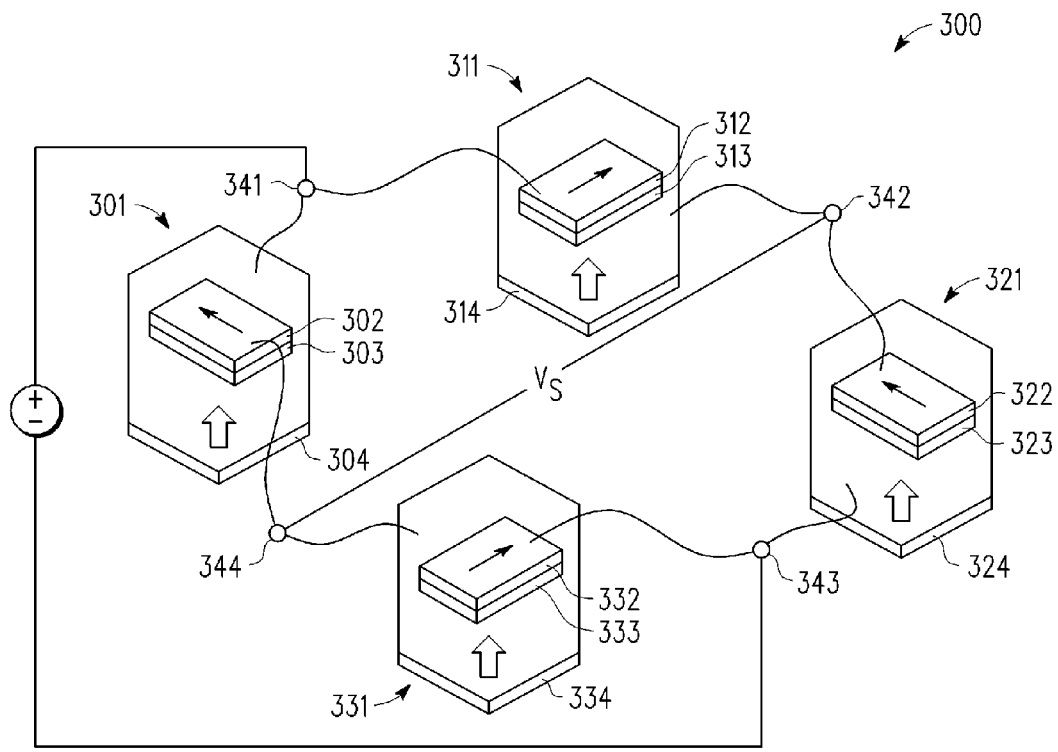
FIG. 2 provides a simplified schematic perspective view of an example field sensor formed by connecting four MTJ sensors in a Wheatstone bridge circuit.

To provide additional insight into the structure and formation of the magnetic field sensor, FIG. 2 provides a simplified schematic perspective view of an example field sensor 300 formed by connecting four MTJ sensors 301, 311, 321, 331 in a Wheatstone bridge circuit. The bridge circuit may be manufactured as part of an existing MRAM or thin-film sensor manufacturing process with only minor adjustments to control the magnetic orientation of the various sensor layers. In particular, the depicted MTJ sensors 301, 311, 321, 331 are formed with pinned reference layers 314, 314, 324, 334 that are each magnetically aligned in a single pinning direction, and with sense layers 302, 312, 322, 332 that are aligned to have different magnetization directions from the magnetization direction of the pinned layers 314, 314, 324, 334. As formed, each MTJ sensor (e.g., 301) includes a first pinned electrode 304 formed with one or more lower ferromagnetic layers, an insulating tunneling dielectric layer 303, and a second sense electrode 302 formed with one or more upper ferromagnetic layers. The pinned and sense electrodes are desirably magnetic materials whose magnetization direction can be aligned. Suitable electrode materials and arrangements of the materials into structures commonly used for electrodes of magnetoresistive random access memory (MRAM) devices and other MTJ sensor devices are well known in the art. For example, the lower layer 304, 314, 324, 334 may be formed with one or more layers of ferromagnetic and antiferromagnetic materials to a combined thickness in the range 10 to 1000 Å, and in selected embodiments in the range 200 to 300 Å. In an example implementation, each of the pinned layers (e.g., 304, 314, 324, 334) is formed with a single ferromagnetic layer and an underlaying anti-ferromagnetic pinning layer. In another example implementation, each pinned layer (e.g., 304) includes a ferromagnetic stack component (e.g., a stack of CFB (Cobalt Fe Boron), Ruthenium (Ru) and CFB) which is 20 to 80 Å thick, and an underlying anti-ferromagnetic pinning layer that is approximately 200 Å thick. The lower anti-ferromagnetic pinning materials may be re-settable materials, such as IrMn, though other materials, such as PtMn, can be used which are not readily re-set at reasonable temperatures. As formed, the pinned reference layers function as a fixed or pinned magnetic layer when the direction of its magnetization is pinned in one direction that does not change during normal operating conditions. As disclosed herein, the heating qualities of the materials used to pin the reference layers 304, 314, 324, 334 can change the fabrication sequence used to form these layers.

Figure 11:
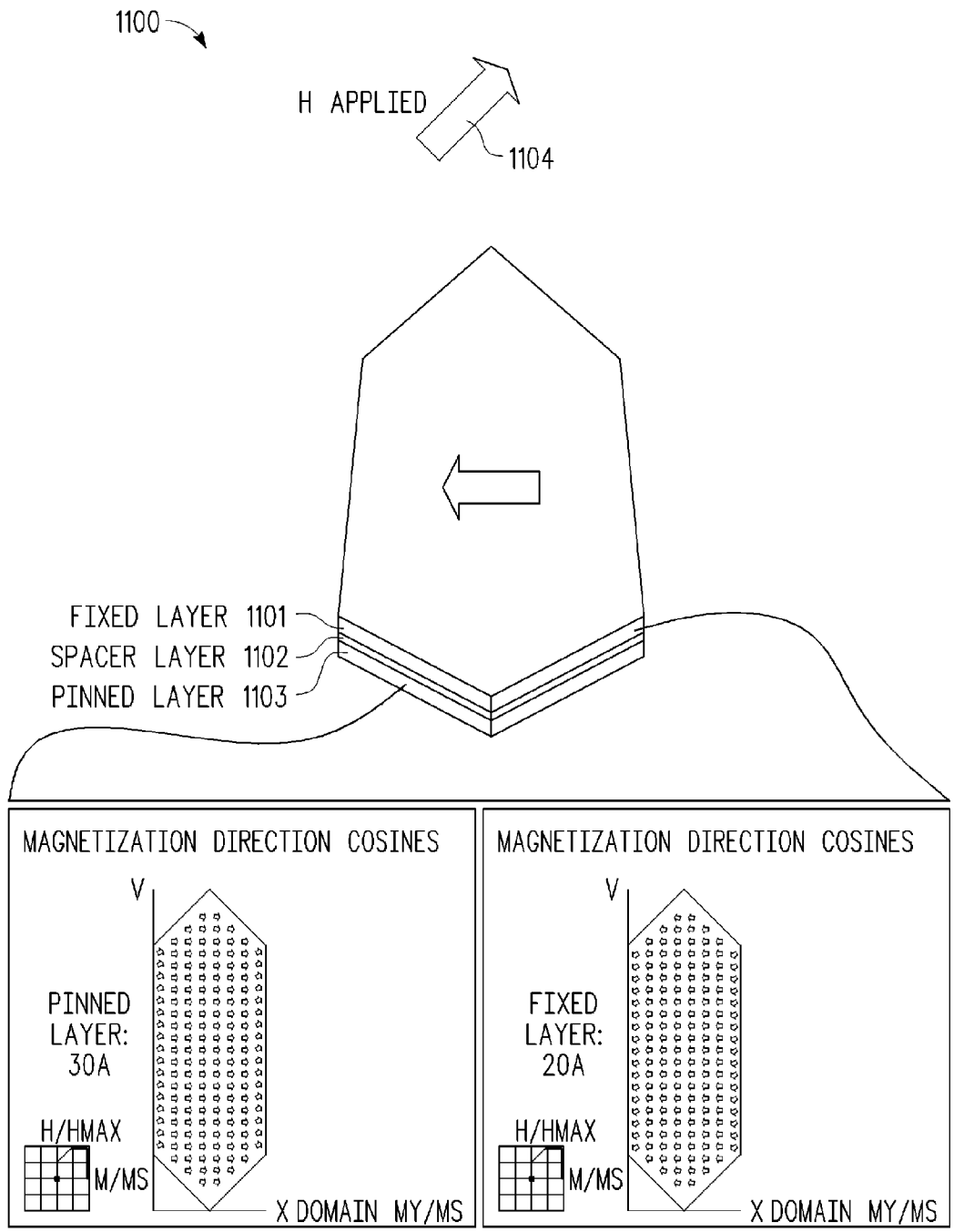
FIG. 11 depicts an imbalanced SAF stack used to form a pinned reference layer.

As shown in FIG. 2, the pinned reference layer (e.g., 304, 314, 324, 334) may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which is used to align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings. For example, FIG. 11 depicts a pinned reference layer 1100 formed from an imbalanced synthetic anti-ferromagnet (SAF) having two differing ferromagnet layers 1101, 1103 separated by a Ruthenium spacer layer 1102, where the ferromagnetic layers above and below 1103 the ruthenium layer 1102 have different magnetic moments. Either or both of the ferromagnetic layers may be formed with CFB (Cobalt Fe Boron) or any desired ferromagnetic alloy. For example, CoFe may be used for the lower layer and CFB may be used for the upper layer in an example embodiment. At certain periodic thicknesses of the Ruthenium spacer layer 1102, the two ferromagnet layers 1101, 1103 will be exchange coupled so that the anti-parallel state is the low energy state. As a result, the net magnetic moment is minimized and the immunity to external field response is strengthened. An example implementation and micromagnetic simulation of an imbalanced SAF stack 1100 is shown in FIG. 11, where the imbalanced SAF 1100 includes a fixed layer 1101 formed with CFB to a thickness of approximately 20 Angstroms, a spacer layer 1102 formed with Ruthenium to a thickness of approximately 10 Angstroms, and a pinned layer 1103 formed with CFB to a thickness of approximately 30 Angstroms. With this example SAF structure, a net moment is created which will respond to the externally applied magnetic field H 1104 as shown in FIG. 11. For a reference layer formed with a SAF that has micron scale dimensions (e.g., greater than approximately 2 um along the short axis), the magnetization tends to align anti-parallel along the short axis instead of along the long axis, hence the short axis sets the pinning direction. This results from the fact that the lowest energy state is for the two layers to close their magnetic flux along the short axis of the patterned shape. In remanance (e.g., after the setting field is removed), the magnetic moment of the largest moment layer (e.g., the lower pinned layer 1103 in this example) aligns so that it is along the short axis of the SAF in the direction that has a positive projection onto the setting field angle (to the right in this example). Conversely, the magnetic moment of the smaller moment layer (e.g., the upper fixed or reference layer 1101 in this example) aligns in the opposite direction from the pinned layer 1103, as shown in FIG. 11.

The upper or sense layers 302, 312, 322, 332, may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the upper ferromagnetic layers 302, 312, 322, 332 function as a sense layer or free magnetic layer because the direction of their magnetization can be deflected by the presence of an external applied field, such as the Earth's magnetic field. As finally formed, the upper or sense layers 302, 312, 322, 332 may be formed with a single ferromagnetic layer having a magnetization direction (indicated with the arrows) that aligns along the long-axis of the patterned shapes 302, 312, 322, 332.

The pinned and sense electrodes may be formed to have different magnetic properties. For example, the pinned electrodes 304, 314, 324, 334 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense electrodes 302, 312, 322, 332 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

As shown in FIG. 2, the pinned electrodes 304, 314, 324, 334 in the MTJ sensors are formed to have a first exemplary magnetization direction in the plane of the pinned electrode layers 304, 314, 324, 334 (identified by the vector arrows pointing toward the top of the drawing of FIG. 2). As described herein, the magnetization direction for the pinned electrodes 304, 314, 324, 334 may be obtained using shape anisotropy of the pinned electrodes, in which case the shapes of the pinned electrodes 304, 314, 324, 334 may each be longer in the direction of the "up" vector arrow. In particular, the magnetization direction for the pinned electrodes 304, 314, 324, 334 may be obtained by first heating the shaped reference layers 304, 314, 324, 334 in the presence of a saturating magnetic field which is oriented non-orthogonally to the axis of longest orientation for the shaped pinned electrodes 304, 314, 324, 334 such that the applied saturating field includes a field component in the direction of the desired pinning direction for the reference layers 304, 314, 324, 334. The magnetization directions of the reference layers are aligned, at least temporarily, with the saturating field. However, by appropriately heating the reference layers during this treatment and removing the saturating field without reducing the heat, the magnetization of the reference layers relaxes along the desired axis of orientation for the shaped pinned electrodes 304, 314, 324, 334. Once the magnetization relaxes, the reference layers can be annealed and/or cooled so that the magnetic field direction of the pinned electrode layers is set in the desired direction for the shaped pinned electrodes 304, 314, 324, 334. With this approach, the formation of the magnetization direction for the pinned electrodes 304, 314, 324, 334 can readily be reconciled with the fabrication steps used to form other pinning electrodes having distinct magnetization direction(s) by simply shaping the other pinning electrodes to have a shape defined anisotropy axis that is aligned with the desired pinning direction, and then applying the saturating field so that it includes a field component in the direction of all the desired pinning directions.

As will be appreciated, the MTJ sensors 301, 311, 321, 331 may be formed to have identical structures that are connected as shown in series by metal interconnections in a standard Wheatstone bridge circuit configuration with both power supply terminals 341, 343 and output signal terminals 342, 344 for the bridge circuit being shown. By connecting in series the unshielded MTJ sensors 301, 311, 321, 331 in a Wheatstone bridge circuit, the field sensor 300 detects the horizontal direction (left-to-right in FIG. 2) component of an externally applied magnetic field, thereby forming an X-axis sensor bridge. In particular, a horizontal field component would deflect the magnetization of the sense electrodes 302, 322 differently from the deflection of the magnetization of the sense electrodes 312, 332, and the resulting difference in sensor conductance/resistance would quantify the strength of the horizontal field component. Though not shown, a Y-axis sensor bridge circuit may also be formed with unshielded MTJ sensors connected in a Wheatstone bridge circuit configuration, though the magnetization direction of the pinning electrodes in the Y-axis sensor bridge circuit would be perpendicular to the magnetization direction of the pinning electrodes 304, 314, 324, 334 in the X-axis sensor bridge.

Figure 3:
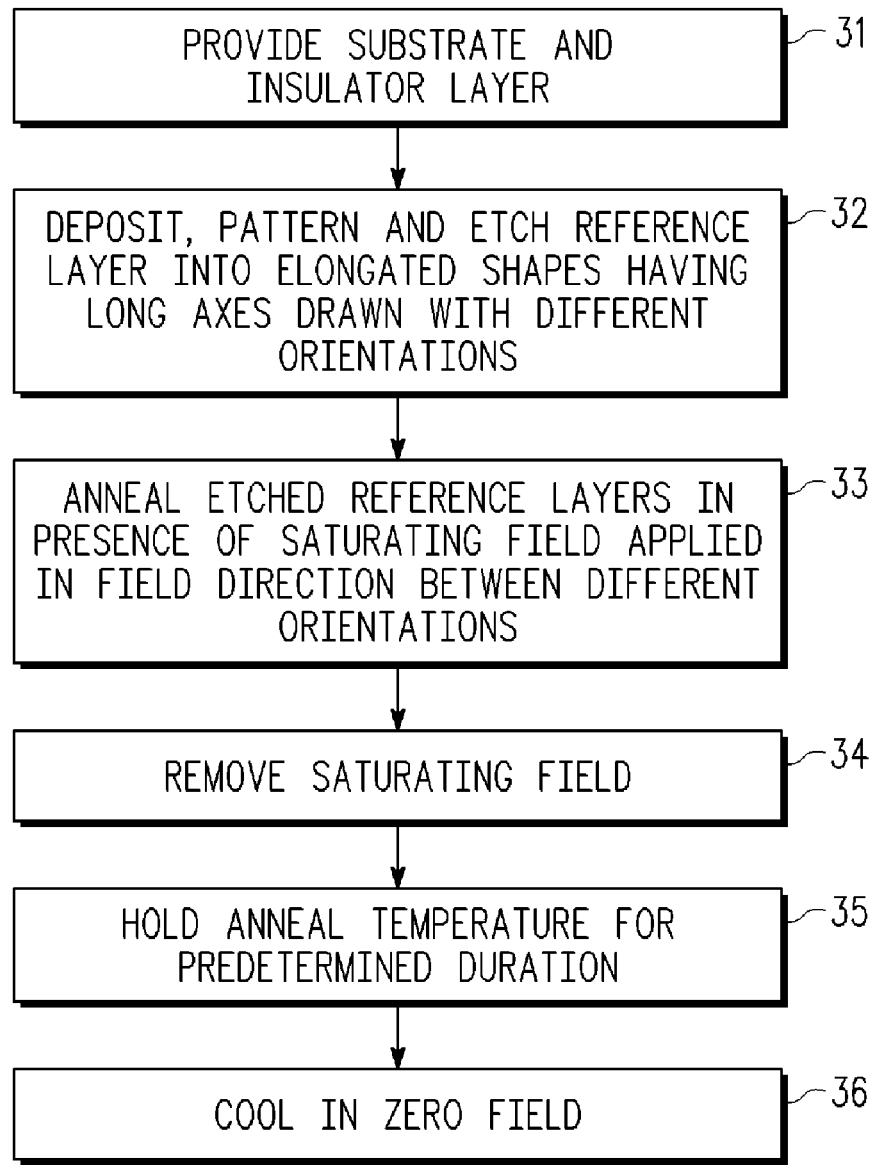
FIG. 3 is a flowchart showing a first example method of fabricating MTJ field sensors which have reference electrodes with different magnetization directions on the same wafer by using a uniform magnetic field setting procedure and shaped reference electrodes patterned from a single reference layer.

Selected embodiments of the present invention may also be illustrated with reference to FIG. 3, which depicts an example flowchart showing a method of fabricating MTJ field sensors which have orthogonal reference layers using a bulk wafer setting procedure to form shaped reference electrodes from a single reference layer. At step 31, a substrate structure is provided using known semiconductor processing techniques. As will be appreciated, the substrate structure includes a substrate that is covered by a base insulator layer, where one or more active circuit elements, such as smart power or analog integrated circuits, are formed on or in the substrate. The substrate and active circuit(s) may be formed as part of a front-end semiconductor fabrication process.

Next, the MTJ core structures are formed by depositing the sensor layers over the base insulator layer using a multi-step fabrication process. At this point, the sensor layers may be formed as part of a back-end magnetics fabrication process which occurs after the front-end semiconductor fabrication process. At step 32, the first of the sensor layers is formed by depositing at least a first anti-ferromagnetic electrode layer (e.g., iridium manganese (IrMn), etc.), and a ferromagnetic layer or synthetic antiferromagnetic (e.g., cobalt iron, cobalt iron boron, ruthenium, nickel, nickel iron and the like, or any combination thereof) over the substrate structure. Though not shown, the first ferromagnetic electrode layer(s) may be deposited in electrical contact with an underlying conductive contact layer. The materials chosen to form the pinning layer and the first ferromagnetic electrode layer should be such that the resultant ferromagnetic layer will have a relatively high pinning strength, and should be sufficiently refractory so as to withstand annealing temperatures (e.g., 200 to 350 degrees Celsius) if used to pin the magnetization direction of the first ferromagnetic electrode layer in a predetermined orientation. Additional sensor layers, such as the tunneling dielectric layer(s) and the sense electrode layer(s), may also be deposited at this time using well known techniques. At step 32, the deposited first ferromagnetic electrode layer(s) are also patterned and selectively etched into elongated shapes having long axes drawing with different orientations. As a result of the etching, each shaped reference layer has a preferred shape anisotropy direction in the direction of the desired pinned magnetization direction.

At step 33, the etched reference layers are heated or annealed in the presence of a saturating field that is applied with a direction that is between the different desired pinned magnetization directions for the different reference layers. For example, if two orthogonally oriented pinned layers are being formed, the applied saturating field may be oriented half-way between the desired orientations of the orthogonal pinned layers. Stated more generally, the applied saturating field should be oriented so that it includes a field component in the direction of each of the desired pinning directions for the reference layers. As for the heating requirement, the properties of the materials used to form the reference layer will control how much heat is to be applied. For example, re-settable materials, such as IrMn, can be annealed above their pinning temperatures at this point since the magnetic orientation can be changed. In any event, the heat step should be controlled so that the magnetizations of the shaped reference layers are free to follow the external magnetic field.

At step 34, the saturating magnetic field is removed, and at step 35, the anneal temperature is maintained for a predetermined duration (e.g., two hours). In the absence of an applied field, the high aspect ratio patterns provide a shape anisotropy that forces the applied magnetization in the shaped reference layers to relax along the respective anisotropy axes of the shaped reference layers. At step 36, the wafer is then cooled in zero field so that the shape-induced magnetizations in the reference layers are pinned, thereby providing multiple orientations of reference layer. By cooling the reference layers below the pinning temperature after the shape-induced magnetizations are obtained in the zero field, the magnetizations of the reference layers become pinned, and will remain rigidly pinned in their respective directions, at least for typical applied field strengths.

Figure 4:
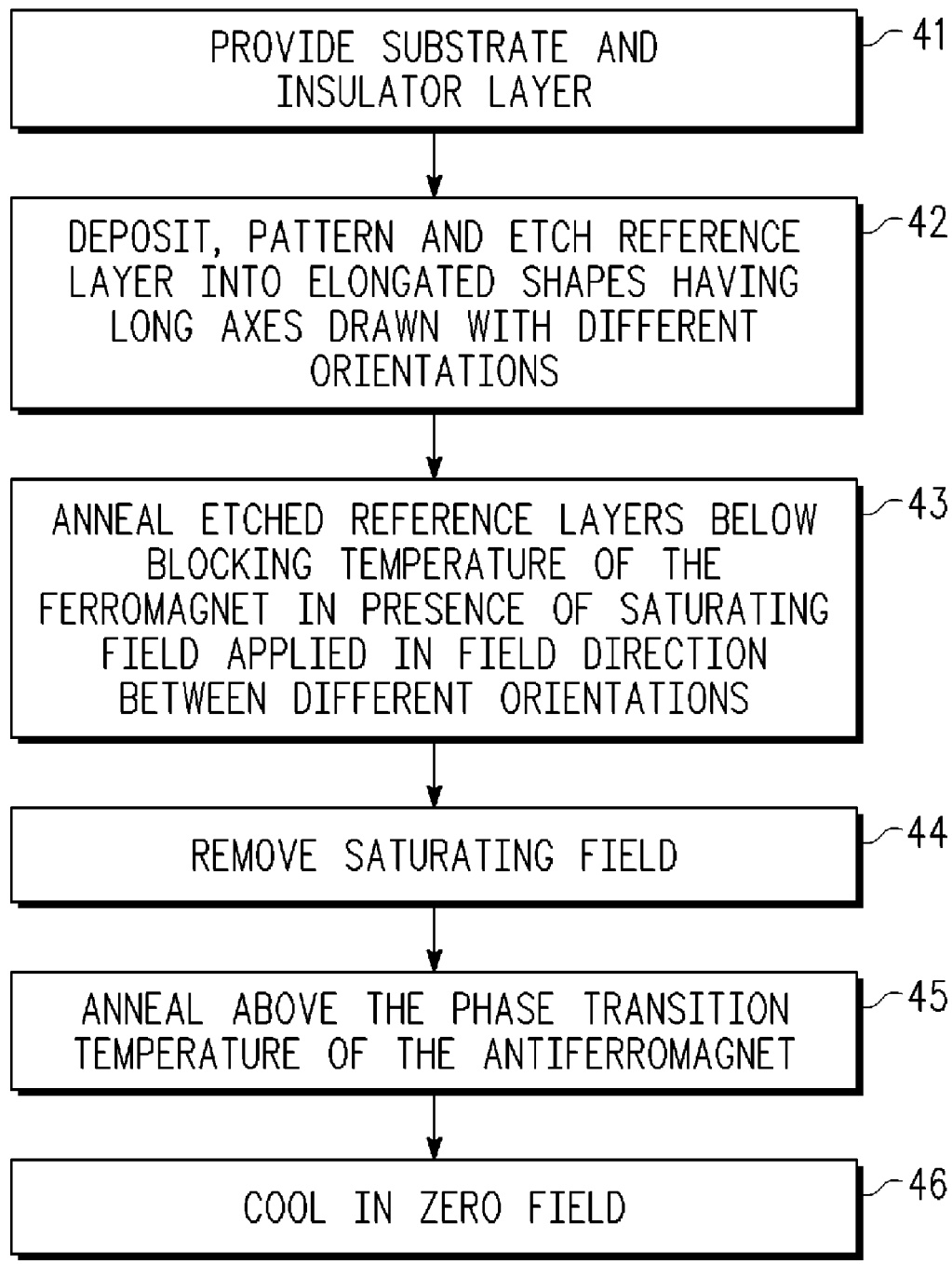
FIG. 4 is a flowchart showing a second example method of fabricating MTJ field sensors which have orthogonal reference layers using a bulk wafer setting procedure and shaped reference electrodes patterned from a single reference layer.

Additional embodiments of the present invention may be illustrated with reference to FIG. 4, which depicts an example flowchart showing a second example method of fabricating MTJ field sensors which have orthogonal reference layers using a bulk wafer setting procedure to form shaped reference electrodes from a single reference layer. At step 41, a substrate structure is provided using known semiconductor processing techniques. Next, the MTJ core structures are formed as part of a back-end magnetics fabrication process by depositing the sensor layers over the base insulator layer using a multi-step fabrication process. At step 42, the first of the sensor layers is formed by depositing at least a first antiferromagnetic electrode layer (e.g., platinum manganese (PtMn), etc.), and a ferromagnetic or synthetic antiferromagnetic layer (e.g., cobalt iron, cobalt iron boron, ruthenium, nickel, nickel iron and the like, or any combination thereof) over the substrate structure. Again, the first ferromagnetic electrode layer(s) may be deposited in electrical contact with an underlying conductive contact layer. The materials chosen to form the pinning layer and the first ferromagnetic electrode layer should be such that the resultant ferromagnetic layer will have a relatively high pinning strength, and should be sufficiently refractory so as to withstand annealing temperatures (e.g., 200 to 350 degrees Celsius) if used to pin the magnetization direction of the first ferromagnetic electrode layer in a predetermined orientation. Additional sensor layers, such as the tunneling dielectric layer(s) and the sense electrode layer(s), may also be deposited at this time using well known techniques. At step 42, the deposited first ferromagnetic electrode layer(s) are also patterned and selectively etched into elongated shapes having long axes with different orientations. As a result of the etching, each shaped reference layer has a preferred shape anisotropy direction in the direction of the desired pinned magnetization direction.

At step 43, the etched reference layers are heated or annealed in the presence of a saturating field that is applied with a field direction that is between the different desired pinned magnetization directions for the different reference layers. Generally speaking, the applied saturating field should be oriented so that it includes a field component in the direction of each of the desired pinning directions for the reference layers. As for the heating requirement, the properties of the materials used to form the reference layer will control how much heat is to be applied. For example, there are reference layer materials (such as PtMn), where the magnetic pinning involves a phase transition which, once set, cannot be undone at reasonable temperatures. With such materials, this magnetization directing process should be kept below the phase transition temperature, and an anneal process can applied later. In any event, the heat step should be controlled so that the magnetizations of the shaped reference layers are free to follow the external magnetic field, and no pinning takes place yet.

At step 44, the saturating magnetic field is removed while the elevated temperature is maintained. In the absence of an applied field, the high aspect ratio patterns provide a shape anisotropy that forces the applied magnetization in the shaped reference layers to relax along the respective anisotropy axes of the shaped reference layers. At step 45, the reference layers (such as for the case with PtMn) are further annealed or heated above the phase transition temperature of the first anti-ferromagnetic electrode layer and held for some time to induce the pinning phase transition before proceeding to step 46. At step 46, the wafer is then cooled in zero field so that the shape-induced magnetizations in the reference layers are pinned, thereby providing multiple reference layer orientations. In this case, by heating the reference layers above the phase transition temperature after the shape-induced magnetizations are obtained in the zero field, the magnetizations of the reference layers become pinned, and will remain rigidly pinned in their respective directions, at least for typical applied field strengths.

Using the techniques disclosed herein, first and second differential sensors (e.g., sensors 201, 211 shown in FIG. 1) may be fabricated together on a monolithic integrated circuit by forming the first reference layers 206-209 with a first pinning direction and simultaneously forming the second reference layers 216-219 with a second pinning direction that is orthogonal to the first pinning direction. These techniques may be further illustrated with a description of an example process flow, beginning with FIG. 5 which depicts a partial cross-sectional view of a multi-sensor structure in which a stack of MTJ sensor layers 60, 70, 80 have been formed over a substrate 40 and base insulator layer 50. When the sensors are to be integrated with semiconductor circuitry, conductive vias through the insulator layer 50, made by methods known by those skilled in the art, will connect conductive portions of the sensors to the underlying circuitry in the substrate 40. Depending on the type of transistor device being fabricated, the substrate 40 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 40 may be implemented as the top semiconductor layer of a semiconductor-on-insulator (SOI) structure. Though not shown, one or more circuit elements may be formed on or in the substrate 40. In addition, a base insulator layer 50 is formed by depositing or growing a dielectric (e.g., silicon dioxide, oxynitride, metal-oxide, nitride, etc.) over the semiconductor substrate 40 using chemical vapor deposition (CVD), plasma-enhanced chemical vapor deposition (PECVD), physical vapor deposition (PVD), atomic layer deposition (ALD), ion beam deposition (IBD), thermal oxidation, or combinations of the above.

Over the base insulator layer 50, the stack of sensor layers is sequentially formed by depositing a first conductive layer (not shown) to serve after etching as a conductive line, one or more lower ferromagnetic layers 60 (to serve after etching as the lower pinned ferromagnetic layer), one or more dielectric layers 70 (to serve after etching as the tunnel barrier layer), one or more upper ferromagnetic layers 80 (to serve after etching as the upper sense ferromagnetic layer), and a second conductive layer (not shown) to serve after etching as the conductive line. Each of the layers may be blanket deposited using known techniques, such as CVD, PECVD, PVD, ALD, IBD, or combinations thereof to a predetermined thickness. In this way, the stack of sensor layers covers the entire wafer so that the stack is formed in the "Sensor 1" area where a first type of sensor (e.g., x-axis sensors) will be formed, and is also formed in the "Sensor 2" area where a second type of sensor (e.g., y-axis sensors) will be formed. In addition, the sensor stack may be formed in "Other" areas where a sensor having any desired orientation will be formed.

Figure 5:
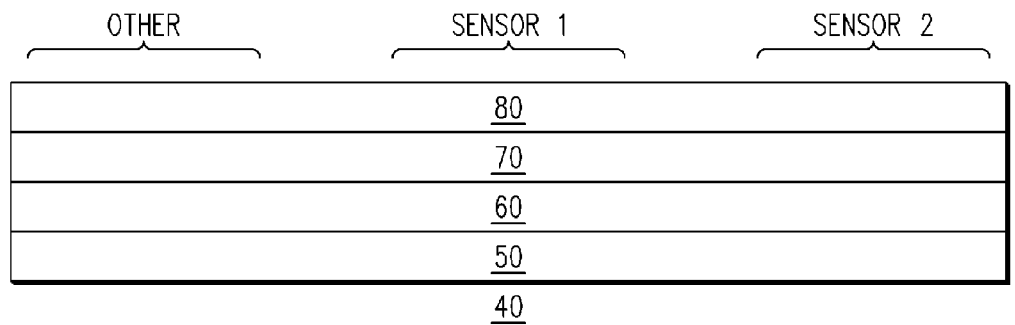
FIG. 5 is a partial cross-sectional view of an integrated circuit in which a stack of MTJ sensor layers have been formed over a substrate.
Figure 6:
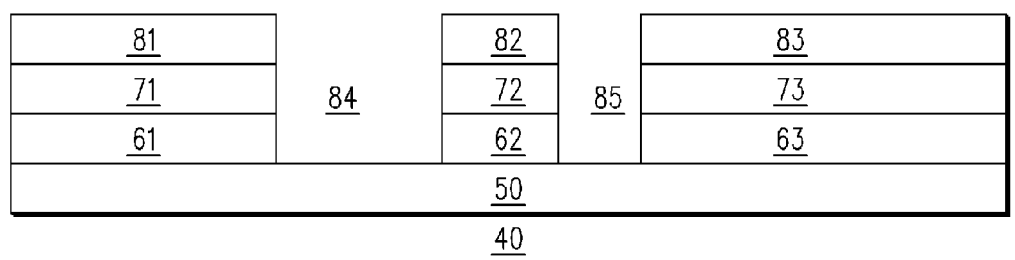
FIG. 6 illustrates processing subsequent to FIG. 5 after the stack of MTJ sensor layers have been selectively etched into predetermined shapes over the substrate.
Figure 7:
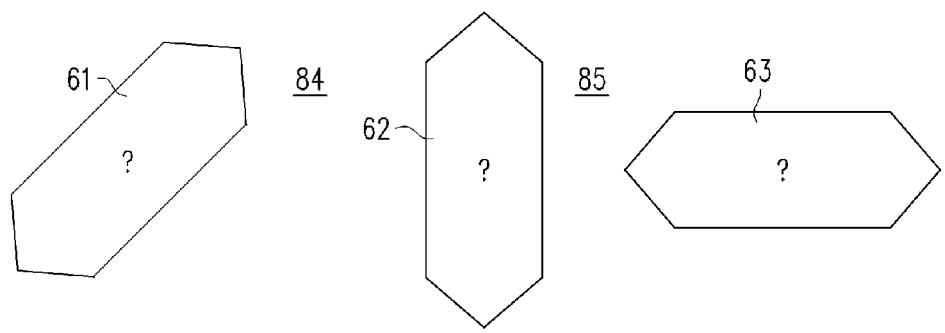
FIG. 7 illustrates a top view to show the predetermined shapes of the reference layers in the stack of MTJ sensor layers formed by the selective etch process.

FIG. 6 illustrates processing of the sensor device structures subsequent to FIG. 5 after the stack of MTJ sensor layers 60, 70, 80 have been selectively etched, thereby defining predetermined shapes for the remnant sensor layers over the substrate 40 in each of the sensor areas. Any desired pattern and etching processes may be used to form the patterned sensor layers, including depositing a hardmask layer, such as silicon nitride (not shown), over the upper ferrogmagnetic layer(s) 80, depositing and patterning a photoresist layer (not shown)

to pattern the hardmask layer, and then selectively etching (e.g., with a reactive ion etching process) the exposed sensor layers using a photoresist layer (not shown) to form the openings 84, 85. To more clearly see how the selective etch process creates different predetermined shapes from the stack of MTJ sensor layers, reference is made to FIG. 7, which provides a simplified top view of the sensor device structures depicted in FIG. 6. As depicted in FIGS. 6 and 7, the openings 84, 85 in the sensor layer stack 60, 70, 80 define the sensor layers 62, 72, 82 in the first sensor area to have a first shape that is oriented to have an easy axis in the desired pinning direction for the finally formed reference layer 62. In similar fashion, the openings 84, 85 define the shape of the sensor layers 63, 73, 83 in the second sensor area so that they have an easy axis in the desired pinning direction for the finally formed reference layer 63. While the openings 84, 85 can be used to define orthogonally oriented shapes 62, 63, any desired orientation can be achieved by properly patterning and controlling the etch process. For example, sensor layers 61, 71, 81 in the "other" sensor area may be defined to have another shape that is oriented to have an easy axis in the desired pinning direction for the finally formed reference layer 61. In addition to being formed as long and narrow shapes, additional shaping may be provided so that each of the pinned reference layers performs more like a single magnetic domain. In FIG. 7, the additional shaping is shown in the reference layers 61, 62, 63, which are shaped to have pointed ends that taper in the corresponding directions of the desired pinning direction for each respective reference layer.

Figure 8:
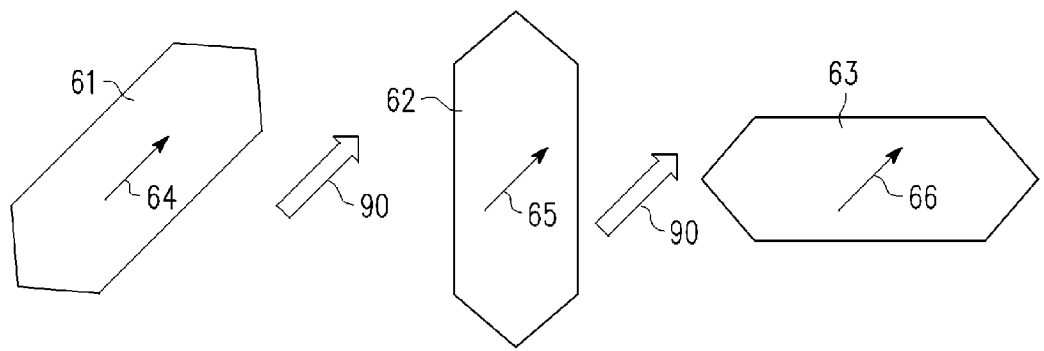
FIG. 8 illustrates processing subsequent to FIG. 7 when the etched reference layers are heated in the presence of saturating field that is aligned between the desired magnetization directions for the finally formed reference layers.

Once the shaped reference layers 61, 62, 63 are formed, the desired pinning direction for the reference layers may be induced by first heating or annealing the wafer in the presence of a saturating field that is oriented between the orientations of the reference layers 61, 62, 63, and then removing the field while maintaining a high temperature. The result of heating and saturating the reference layers is shown in FIG. 8, which illustrates processing of the sensor device structures subsequent to FIG. 7 when the etched reference layers 61, 62, 63 are heated in the presence of saturating field. As shown in FIG. 8, the saturating field is aligned in a direction 90 that is between the desired magnetization directions for the finally-formed reference layers. However, at this stage in the process, the magnetizations of the reference layers 61, 62, 63 (as shown with the magnetization vectors 64, 65, 66, respectively), when heated sufficiently, follow the external magnetic field 90.

Figure 9:
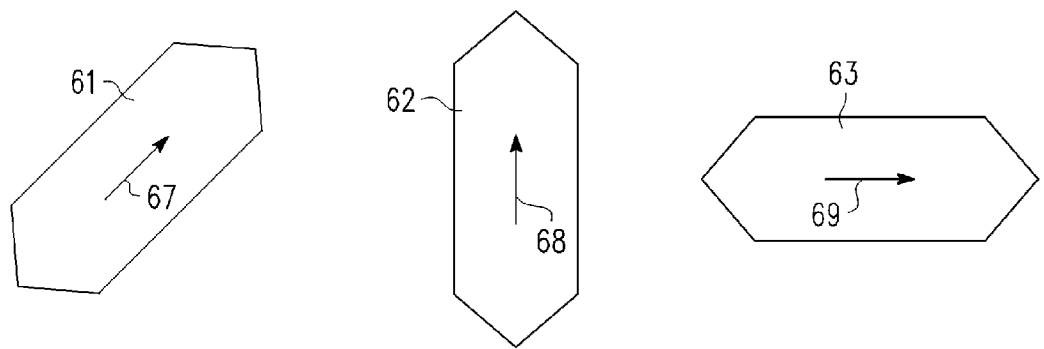
FIG. 9 illustrates processing subsequent to FIG. 8 after the saturating field is removed and the etched stack of MTJ sensors are cooled, thereby causing the magnetization of the etched reference layer to be pinned along the long axis.

FIG. 9 illustrates the magnetization orientations of the reference layers in the sensor device structures subsequent to FIG. 8 after the saturating field 90 is removed and the etched stack of MTJ sensor layers are cooled. By cooling the wafer in a zero field, the respective shapes of the reference layers 61, 62, 63 provide shape anisotropy that causes the magnetization of each reference layer to relax along a desired direction. Thus, the magnetization 68 of first reference layer 62 follows its shape so that it is aligned with the desired dimension of the shaped reference layer 62 (e.g., in the y-axis direction), thereby forming the desired pinning direction for the finally-formed reference layer 62. In similar fashion, the desired pinning direction for the finally-formed reference layer 63 is induced when the magnetization 69 of second reference layer 63 follows its shape anisotropy (e.g., in the x-axis direction). Of course, any desired pinning direction can be induced by properly shaping the reference layer, as shown with the reference layer 61 where the magnetization 67 follows the shape anisotropy of reference layer 61 (e.g., at 45 degrees from the y-axis).

Figure 12:
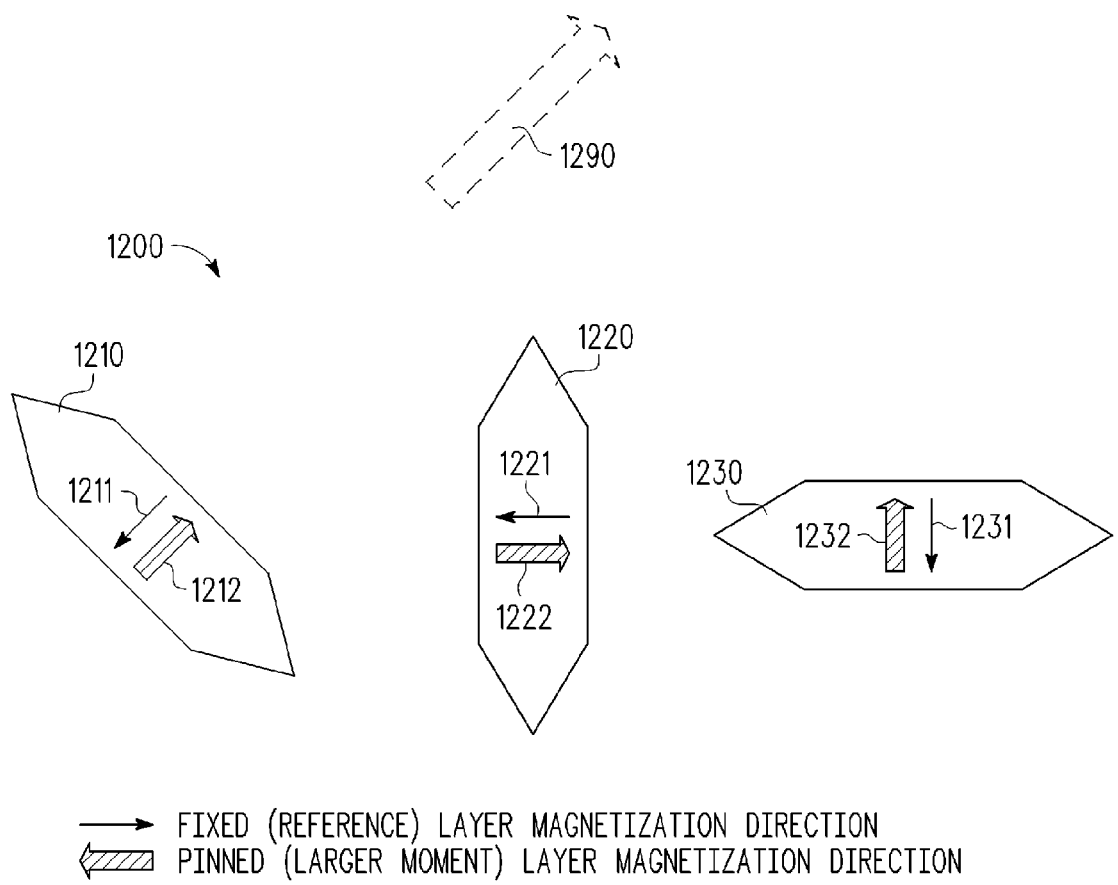
FIG. 12 illustrates processing of the pinned and reference layers formed with imbalanced SAF stacks after the saturating field is removed and the etched stack of MTJ sensors are cooled, thereby causing the magnetization of the etched reference layers to be pinned along the short axis.

FIG. 12 illustrates processing of pinned and reference layers 1200 that are formed by etching imbalanced SAF stacks 1210, 1220, 1230, annealing the layers 1200 in the presence of a saturating field that is oriented between the short-axis orientations of the reference layers, and then removing the saturating field 1290 (as indicated with the dashed line field arrow) and cooling the etched stack of MTJ sensors, thereby causing the magnetization of the etched reference layers 1210, 1220, 1230 to be pinned along their respective short axes. As illustrated, the magnetization orientations of the etched reference layers 1210, 1220, 1230 are pinned along the short axis of the etched reference layers. Thus, in the imbalanced SAF stack 1210, the reference layer magnetization 1211 and pinned layer magnetization 1212 are substantially anti-parallel to each other and orthogonal to the long axis of the etched reference layer 1210. Similarly, the reference layer magnetization 1221 and pinned layer magnetization 1222 in the imbalanced SAF stack 1220 are substantially anti-parallel to each other and orthogonal to the long axis of the etched reference layer 1220, and likewise for the etched reference layer 1230. With the imbalanced SAF stack embodiment depicted in FIG. 12, the long axis of reference layer 1210 is patterned orthogonal to the direction used for a single reference layer 61 shown in FIG. 8 in order to provide a final reference direction that is midway between the orthogonal directions of reference layers 1220 and 1220.

Figure 10:
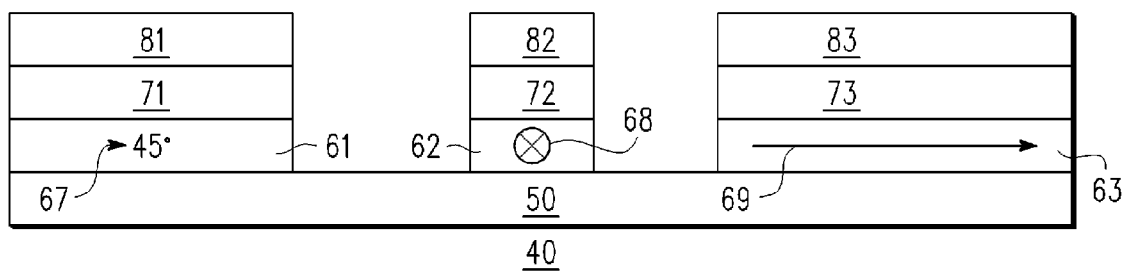
FIG. 10 is a partial cross-sectional view of the stack of MTJ sensor layers showing the pinned magnetization directions in the finally-formed reference layers.

To further illustrate the resulting formation of multiple orientations in different, finally-formed reference layers, reference is now made to FIG. 10 which provides a cross-sectional view of the etched stack of MTJ sensor layers depicted in FIG. 9. As depicted in FIGS. 9 and 10, the etched sensor layer stack 62, 72, 82 in the first sensor area has a reference layer that is pinned in a first pinning direction (e.g., "into" the plane of the drawing in FIG. 10), the etched sensor layer stack 63, 73, 83 in the second sensor area has a reference layer that is pinned in a second pinning direction (e.g., to the "right" in the plane of the drawing in FIG. 10), and the etched sensor layer stack 61, 71, 81 in the other sensor area has a reference layer that is pinned in yet another pinning direction (e.g., at 45 degrees from the plane of the drawing in FIG. 10).

At this point in the fabrication process, each of the upper ferromagnetic or layer(s) 81, 82, 83 (and the tunnel barrier layer(s)) will have been selectively etched into the same shape as the underlying reference layer. However, where the final shape of the sense layers will be smaller than the underlying pinned layers, a second etch sequence may be used to define the final shapes of the different sense layers from the remnant portions of the upper ferromagnetic layer(s) 81, 82, 83. The second etch sequence defines high aspect ratio shapes for the sense layers by using a patterned mask and etch process (e.g., reactive ion etching) to remove all unmasked layers down to and including the unmasked upper ferromagnetic layer(s), but leaving intact the underlying shaped pinning layers. The defined high aspect ratio shapes for the sense layers are oriented so that each sense layer has a shape anisotropy axis. In other words, the long axis for each sense layer is drawn to create the desired easy axis magnetization direction.

It will be appreciated that additional processing steps will be used to fabricate MTJ sensor structures. As examples, one or more dielectric, ferromagnetic and/or conductive layers may be deposited, patterned and etched using well known techniques, along with conventional backend processing (not depicted), typically including formation of multiple levels of interconnect that are used to connect the sensor structures in a desired manner to achieve the desired functionality. Thus, the specific sequence of steps used to complete the fabrication of the sensor structures may vary, depending on the process and/or design requirements.

The disclosed fabrication process may be used to form a magnetic field sensor from two differential sensor configurations which require only two distinct pinning axes which are formed with a single material and annealing step, where each differential sensor is formed from a bridge structures. The distinct pinning axes may be obtained using shape anisotropy of differently shaped pinning layers in combination with a carefully selected process for heating the reference layers in the presence of a properly aligned saturating field.

By now it should be appreciated that there has been provided a ferromagnetic thin-film based magnetic field sensor with two or more reference layer directions and method for fabricating same. As disclosed, a semiconductor substrate and first insulating layer are provided, and a sensor layer stack is formed over the first insulating layer, where the sensor layer stack includes an optional pinning layer formed with an antiferromagnetic material (e.g., IrMn or PtMn), a reference layer formed over the pinning layer and first insulating layer, a nonmagnetic intermediate layer formed on the reference layer, and a second ferromagnetic layer formed on the nonmagnetic intermediate layer. The sensor layer stack is selectively etched to form first and second etched electrode stacks, where the first electrode stack has a first shape anisotropy to set a first reference direction, and where the second electrode stack has a second shape anisotropy to set a second reference direction. After etching the electrode stacks, a saturating field is applied to be substantially parallel to the substrate and oriented between the first and second reference directions until each reference layer of the first and second electrode stacks has a magnetization that is aligned with the saturating field. By removing the saturating field, the first shape anisotropy sets the magnetization of the reference layer of the first electrode stack, and the second shape anisotropy sets the magnetization of the reference layer of the second electrode stack. For example, the magnetization direction of each of the reference layers in the first and second electrode stacks may be set along a longer (or shorter) axis dimension of the first and second electrode stacks, respectively. Where the first reference direction (and first shape anisotropy) is orthogonal to the second reference direction (and second shape anisotropy), the saturating field may be applied substantially parallel to the substrate at an angle that is offset 45 degrees from both the first reference direction and the second reference direction. In other embodiments where the first reference direction (and first shape anisotropy) is less than 180 degrees from the second reference direction (and second shape anisotropy), the saturating field may be applied substantially parallel to the substrate at an angle that is offset equally from both the first reference direction and the second reference direction. Stated more generally, the saturating field may be applied substantially parallel to the substrate at an angle that has a field component along each of the two or more reference layer directions. The application of the saturating field may, but need not necessarily be, accompanied by a heating process whereby the first and second electrode stacks are heated at an elevated temperature, and a cooling process after removing the saturating field to set the magnetization of the reference layer in the first electrode stack along a first shape-defined axis, and to set the magnetization of the reference layer in the second electrode stack along a second shape-defined axis. For example, the heat step may be implemented, in selected embodiments, by heating the first and second electrode stacks in a saturating field at an elevated temperature above a blocking temperature of first and second antiferromagnetic pinning layers formed in the first and second electrode stacks, respectively, in which case the removal of the saturating field allows the first shape anisotropy to set the magnetization of a pinned layer in the first electrode stack, and allows the second shape anisotropy to set the magnetization of a pinned layer in the second electrode stack. In addition or in the alternative, the first and second electrode stacks may be heated after removing the saturating field at or above an antiferromagnetic crystalline phase formation temperature of first and second antiferromagnetic layers formed in the first and second electrode stacks, respectively. By subsequently cooling the first and second electrode stacks, the magnetization of a pinned layer in the first electrode stack is pinned along a first shape-defined axis, and the magnetization of a pinned layer in the second electrode stack is pinned along a second, different shape-defined axis.

In another form, there is provided a ferromagnetic thin-film based magnetic field sensor with two or more reference directions and method for fabricating same. As disclosed, a reference layer structure is formed over and insulated from a substrate, where the reference layer structure includes an imbalanced synthetic anti-ferromagnet formed with first and second ferromagnet layers separated by a spacer layer and having different magnetic moments. There may also be a pinning layer formed below the imbalance SAF with an antiferromagnetic material (e.g., IrMn or PtMn). The reference layer structure is selectively etched to form first and second etched electrode stacks, where the first electrode stack has a first shape anisotropy to set a first reference direction, and where the second electrode stack has a second shape anisotropy to set a second reference direction. After etching the electrode stacks, a saturating field is applied to be substantially parallel to the substrate and oriented between the first and second reference directions until each of the first and second electrode stacks (e.g., the SAF in each stack) has a magnetization that is aligned with the saturating field. By removing the saturating field, the first shape anisotropy sets the magnetization of the first and second ferromagnetic layers of the first electrode stack, and the second shape anisotropy sets the magnetization of the first and second ferromagnetic layers of the second electrode stack. For example, the magnetization direction of each of the first and second ferromagnetic layers in the first and second electrode stacks may be set along a longer (or shorter) axis dimension of the first and second electrode stacks, respectively. To this end, the first electrode stack has a first shape anisotropy in which a first longer (or shorter) axis dimension is aligned with the first reference direction, and the second electrode stack has a second shape anisotropy in which a second longer (or shorter) axis dimension is aligned with the second reference direction. Stated more generally, the saturating field may be applied substantially parallel to the substrate at an angle that has a field component along each of the two or more reference directions. The application of the saturating field may, but need not necessarily be, accompanied by a heating process whereby the first and second electrode stacks are heated at an elevated temperature, and a cooling process after removing the saturating field to set the magnetization of the imbalanced synthetic anti-ferromagnet in the first electrode stack along a first shape-defined axis, and to set the magnetization of the imbalanced synthetic anti-ferromagnet in the second electrode stack along a second, different shape-defined axis. For example, the heat step may be implemented, in selected embodiments, by heating the first and second electrode stacks in a saturating field at an elevated temperature above a blocking temperature of first and second antiferromagnetic pinning layers formed in the first and second electrode stacks, respectively, in which case the removal of the saturating field allows the first shape anisotropy to set the magnetization of a pinned layer in the first electrode stack, and allows the second shape anisotropy to set the magnetization of a pinned layer in the second electrode stack. In addition or in the alternative, the first and second electrode stacks may be heated after removing the saturating field at or above an antiferromagnetic crystalline phase formation temperature of first and second antiferromagnetic layers formed in the first and second electrode stacks, respectively. By subsequently cooling the first and second electrode stacks, the magnetization of a pinned layer in the first electrode stack is pinned along a first shape-defined axis, and the magnetization of a pinned layer in the second electrode stack is pinned along a second, different shape-defined axis.

In yet another form, there is provided a ferromagnetic thin-film based magnetic field sensor having two or more reference layer magnetization directions, and associated manufacturing method. As disclosed, the sensor includes first and second sensor layer stacks formed over and insulated from a subtracted. The first and second sensor layer stacks each include a reference layer that is formed over the first insulating layer, and may also each include an antiferromagnetic layer adjacent to the respective reference layers. In selected embodiments, each of the first and second reference layers is implemented as an imbalanced synthetic antiferromagnet formed with first and second ferromagnet layers separated by a spacer layer, where the first and second ferromagnetic layers have different magnetic moments. In addition, the first and second ferromagnetic layers may each have a magnetization that is aligned along a short (or long) axis of the first and second reference layers, respectively. As formed, the first electrode stack has a first shape anisotropy defining a first reference direction for the first reference layer, and the second electrode stack has a second shape anisotropy defining a second reference direction for the second reference layer that is different from the first reference direction.

Although the described exemplary embodiments disclosed herein are directed to various sensor structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A ferromagnetic thin-film based magnetic field sensor comprising two or more reference layer magnetization directions, comprising:
   a substrate having a surface forming a plane;
   a first insulating layer over the substrate;
   a first sense axis comprising a first Wheatstone bridge comprising first, second, third, and fourth sensor layer stacks, respectively, each over the first insulating layer, each of the first, second, third, and fourth sensor layer stacks having a tunnel barrier layer between a sense layer and a reference layer structure, wherein each of the reference layer structures within the first, second, third, and fourth sensor layer stacks have a first reference magnetization direction; and
   a second sense axis comprising a second Wheatstone bridge and comprising fifth, sixth, seventh, and eighth sensor layer stacks, respectively, over the first insulating layer, each of the fifth, sixth, seventh, and eighth sensor layer stacks comprising a tunnel barrier layer between a sense layer and a reference layer structure wherein each of the reference layer structures within the fifth, sixth, seventh, and eight sensor layer stacks have a second identical reference magnetization direction;
   wherein the first, second, third, fourth, fifth, sixth, seventh, and eighth reference layer structures each comprise an imbalanced synthetic antiferromagnet formed with first and second ferromagnetic layers separated by a spacer layer, the first and second ferromagnetic layers having different magnetic moments, the first, second, third, and fourth reference layer structures having a first width and a first shape oriented parallel to the plane to set a first reference direction along the short axis of the first, second, third, and fourth reference layer structures, and the fifth, sixth, seventh, and eighth reference layer structures having a second width and a second shape oriented parallel to the plane to set second reference direction along the short axis of the fifth, sixth, seventh, and eighth reference layer structure that is different from the first reference direction.

2. The ferromagnetic thin-film based magnetic field sensor of claim 1, wherein the first, second, third, fourth, fifth, sixth, seventh, and eighth reference layer structures are patterned with micron-scaled dimensions.

3. The ferromagnetic thin-film based magnetic field sensor of claim 1, wherein the short axes of the first, second, third, fourth, fifth, sixth, seventh, and eighth reference layer structures are greater than about 2 micrometers.

4. The ferromagnetic thin-film based magnetic field sensor of claim 1, wherein the short axes of the first, second, third, fourth, fifth, sixth, seventh, and eighth reference layer structures are about 2 micrometers.

5. The ferromagnetic thin-film based magnetic field sensor of claim 1, wherein the first, second, third, fourth, fifth, sixth, seventh, and eighth sensor layer stacks each comprise an antiferromagnetic layer adjacent to the first, second, third, fourth, fifth, sixth, seventh, and eighth reference layer structures, respectively.

6. The ferromagnetic thin-film based magnetic field sensor of claim 5, wherein the antiferromagnetic layer comprises PtMn.

7. The ferromagnetic thin-film based magnetic field sensor of claim 1 wherein the resistance of the first sensor layer stack is determined by the angle of a magnetization of the first sense layer with respect to a magnetization of the first reference layer, the resistance of the second sensor layer stack is determined by the angle of a magnetization of the second sense layer with respect to a magnetization of the second reference layer, the resistance of the third sensor layer stack is determined by the angle of a magnetization of the third sense layer with respect to a magnetization of the third reference layer, the resistance of the fourth sensor layer stack is determined by the angle of a magnetization of the fourth sense layer with respect to a magnetization of the fourth reference layer, the resistance of the fifth sensor layer stack is determined by the angle of a magnetization of the fifth sense layer with respect to a magnetization of the fifth reference layer, the resistance of the sixth sensor layer stack is determined by the angle of a magnetization of the sixth sense layer with respect to a magnetization of the sixth reference layer, the resistance of the seventh sensor layer stack is determined by the angle of a magnetization of the seventh sense layer with respect to a magnetization of the seventh reference layer, the resistance of the eighth sensor layer stack is determined by the angle of a magnetization of the eighth sense layer with respect to a magnetization of the eighth reference layer.

8. A ferromagnetic thin-film based magnetic field sensor comprising two or more reference layer magnetization directions, comprising:
an insulating layer having a surface defining a plane;
a first sense axis comprising first, second, third, and fourth bridge legs forming a first Wheatstone bridge, each of the first, second, third, and fourth bridge legs comprising a magnetic tunnel junction formed from a tunnel barrier layer between a ferromagnetic sense layer and an imbalanced synthetic antiferromagnet positioned over the insulating layer, each of the first, second, third, and fourth bridge legs having a first identical reference magnetization direction, and comprising:
a first set of reference layer structures having a first width and a first shape oriented parallel to the plane, comprising:
a first ferromagnetic layer having a first magnetic moment;
a first coupling spacer layer positioned on the first ferromagnetic layer; and
a second ferromagnetic layer positioned on the first coupling spacer layer and having a second magnetic moment different from the first magnetic moment; and
a second sense axis comprising fifth, sixth, seventh, and eighth bridge legs forming a second Wheatstone bridge, each of the fifth, sixth, seventh, and eighth bridge legs comprising a magnetic tunnel junction formed from a tunnel barrier layer between a ferromagnetic sense layer and an imbalanced synthetic antiferromagnet positioned over the insulating layer, each of the fifth, sixth, seventh, and eighth bridge legs having a second identical reference magnetization direction, and comprising:
a second set of reference layer structures having a second width and a second shape comprising:
a third ferromagnetic layer having a third magnetic moment;
a second coupling spacer layer positioned on the third ferromagnetic layer; and
a fourth ferromagnetic layer positioned on the second coupling spacer layer and having a fourth magnetic moment different from the third magnetic moment,
wherein the ferromagnetic layer having the largest magnetic moment of each imbalanced synthetic antiferromagnet determines the reference layer magnetization direction of the respective imbalanced synthetic antiferromagnet, and the in-plane orientation of the first set of reference layer structures is different from the in-plane orientation of the second set of reference layer structures.

9. The ferromagnetic thin-film based magnetic field sensor of claim 8 wherein the shape of the first set of reference layer structures is oriented differently from the shape of the second set of reference layer structure, and the shape and imbalance of the first and second set of reference layer structures are configured together to set the reference directions of each set of reference layer structures.

10. The ferromagnetic thin-film based magnetic field sensor of claim 9 wherein the orientations of the first and second sets of reference layer structures are approximately orthogonal to one another.

11. The ferromagnetic thin-film based magnetic field sensor of claim 8, where the first and second imbalanced synthetic antiferromagnets each have a magnetization that is aligned along a short axis of the first and second reference layer structures, respectively.

12. The ferromagnetic thin-film based magnetic field sensor of claim 8, where the first and second imbalanced synthetic antiferromagnets each comprise an antiferromagnetic layer adjacent to the first and second reference layer structures, respectively.

13. The ferromagnetic thin-film based magnetic field sensor of claim 12, wherein the antiferromagnetic layer is PtMn.

14. The ferromagnetic thin-film based magnetic field sensor of claim 8, wherein the first and second set of reference layer structures are patterned with micron-scaled dimensions.

* * * * *